United States Patent
Lang et al.

(10) Patent No.: US 11,416,030 B2
(45) Date of Patent: *Aug. 16, 2022

(54) EDGE-TO-EDGE DISPLAY DEVICES AND RELATED METHODS

(71) Applicant: INTEL CORPORATION, Santa Clara, CA (US)

(72) Inventors: John Lang, Portland, OR (US); Seh Kwa, Saratoga, CA (US); Zhiming Zhuang, Sammamish, WA (US); Jackson Tsai, New Taipei (TW); Jun Jiang, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/026,877

(22) Filed: Sep. 21, 2020

(65) Prior Publication Data

US 2021/0004052 A1      Jan. 7, 2021

Related U.S. Application Data

(63) Continuation of application No. 16/230,352, filed on Dec. 21, 2018, now Pat. No. 10,782,736.
(Continued)

(51) Int. Cl.
*G06F 1/16*    (2006.01)
*F21V 8/00*    (2006.01)
(Continued)

(52) U.S. Cl.
CPC ......... *G06F 1/1637* (2013.01); *G02B 6/0068* (2013.01); *G02B 6/0083* (2013.01);
(Continued)

(58) Field of Classification Search
CPC ... G06F 1/1637; G06F 1/1683; G02B 6/0091; G02B 6/0088; G02B 6/0068;
(Continued)

(56) References Cited

U.S. PATENT DOCUMENTS 10,209,545 B2 ‡   2/2019   Chen ................. G02F 1/133305
10,782,736 B2     9/2020   Lang et al.
(Continued)

OTHER PUBLICATIONS

European Patent Office, "Communication pursuant to Article 94(3) EPC," issued in connection with European Patent Application No. 19152920.5, dated Jun. 25, 2020, 5 pages.‡
(Continued)

*Primary Examiner* — Joseph L Williams
*Assistant Examiner* — Jose M Diaz
(74) *Attorney, Agent, or Firm* — Hanley, Flight & Zimmerman, LLC

(57) ABSTRACT

Disclosed herein are example edge-to-edge display devices and related methods. An example display device includes a display screen and a backlight including a light guide frame defining a cavity therein. The example display device includes an integrated circuit coupled to the display screen. The example display device includes a flexible printed circuit in communication with the integrated circuit and including an electrical component coupled thereto. The electrical component is at least partially disposed in the cavity of the light guide frame.

20 Claims, 6 Drawing Sheets

Related U.S. Application Data

(60) Provisional application No. 62/633,016, filed on Feb. 20, 2018.

(51) Int. Cl.
*H05K 1/11* (2006.01)
*G02F 1/1333* (2006.01)

(52) U.S. Cl.
CPC ......... *G02B 6/0088* (2013.01); *G02B 6/0091* (2013.01); *G06F 1/1616* (2013.01); *G06F 1/1681* (2013.01); *G06F 1/1683* (2013.01); *H05K 1/118* (2013.01); *G02B 6/002* (2013.01); *G02F 1/133308* (2013.01)

(58) Field of Classification Search
CPC ...... G02B 6/0083; G02B 6/002; H05K 1/118; H05K 1/189; H05K 2201/10136; H05K 2201/10128; G02F 1/133308
See application file for complete search history.

(56) References Cited

U.S. PATENT DOCUMENTS

| | | | | |
|---|---|---|---|---|
| 2008/0303972 | A1‡ | 12/2008 | Han | G02F 1/13452 349/58 |
| 2011/0164199 | A1‡ | 7/2011 | Han | G02F 1/13452 349/58 |
| 2014/0362327 | A1‡ | 12/2014 | Ohkubo | G02F 1/133608 349/58 |
| 2015/0029441 | A1‡ | 1/2015 | Kang | G02B 6/0031 349/65 |
| 2017/0045675 | A1‡ | 2/2017 | Ryu | G02F 1/13306 |
| 2018/0158983 | A1‡ | 6/2018 | Jang | G09F 13/22 |
| 2019/0121394 | A1 | 4/2019 | Lang et al. | |

OTHER PUBLICATIONS

NXP, "Well-proven Approach from NXP Reduces Medical System Design Costs," Chip-on Glass LCD Driver Technology, NXP B.V., Jul. 2012, 9 pages.‡

European Patent Office, "Invitation pursuant to Rule 62a(1) EPC," issued in connection with European Application No. 19152920.5, dated Mar. 21, 2019, 2 pages.‡

European Patent Office, "Extended European Search Report," issued in connection with European Application No. 19152920.5, dated Jun. 19, 2019, 8 pages.‡

European Patent Office, "Communication pursuant to Article 94(3) EPC," issued in connection with European Patent Application No. 19152920.5, dated May 25, 2021, 5 pages.

United States Patent and Trademark Office, "Non-Final Office Action," issued in connection with U.S. Appl. No. 16/230,352, dated Jan. 27, 2020, 11 pages.

United States Patent and Trademark Office, "Notice of Allowance," issued in connection with U.S. Appl. No. 16/230,352, dated May 13, 2020, 10 pages.

United States Patent and Trademark Office, "Corrected Notice of Allowability," issued in connection with U.S. Appl. No. 16/230,352, dated Aug. 5, 2020, 5 pages.

European Patent Office, "Communication pursuant to Article 94(3) EPC," issued in connection with European Patent Application No. 19152920.5, dated Apr. 22, 2022, 4 pages.

‡ imported from a related application

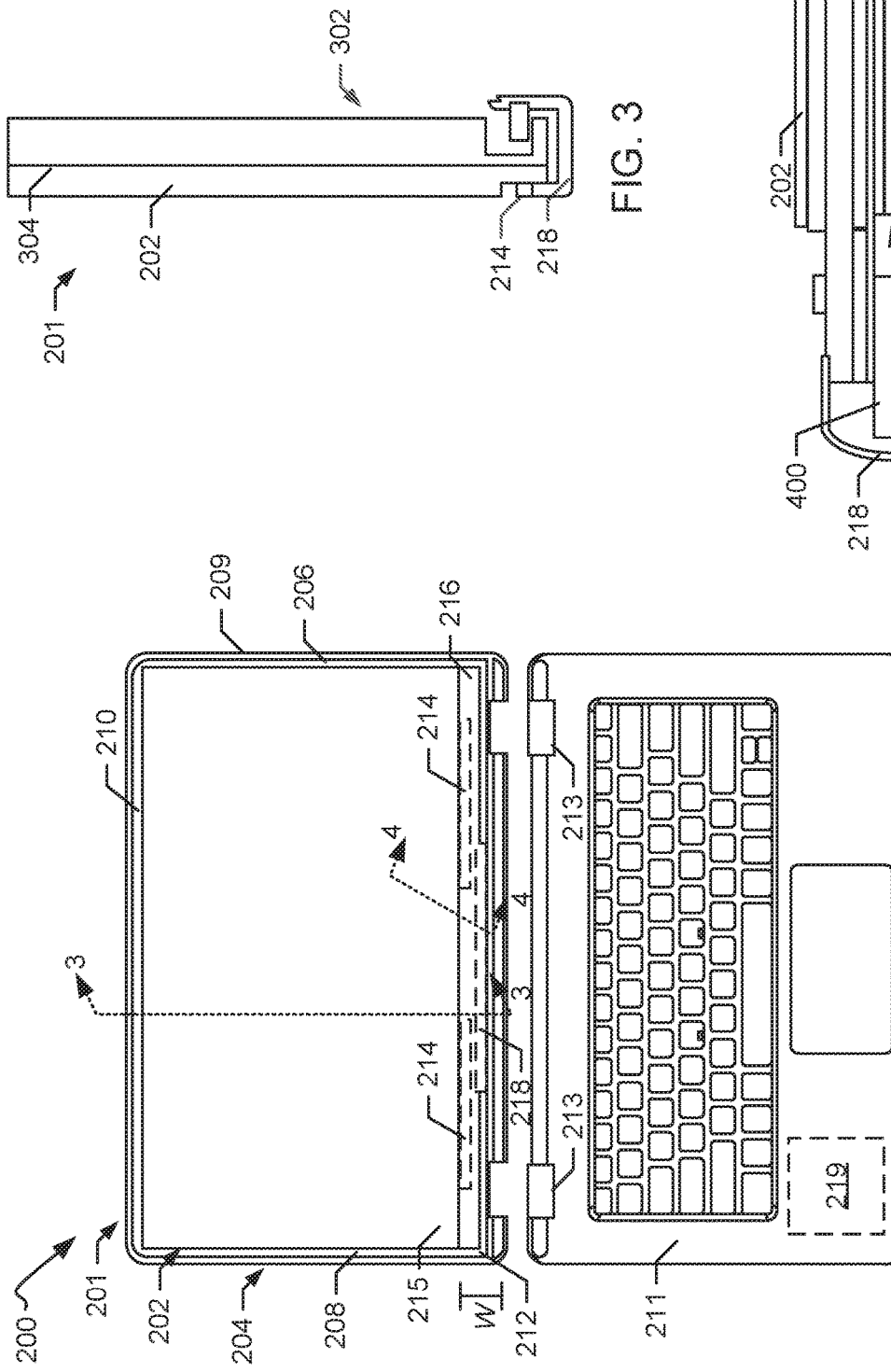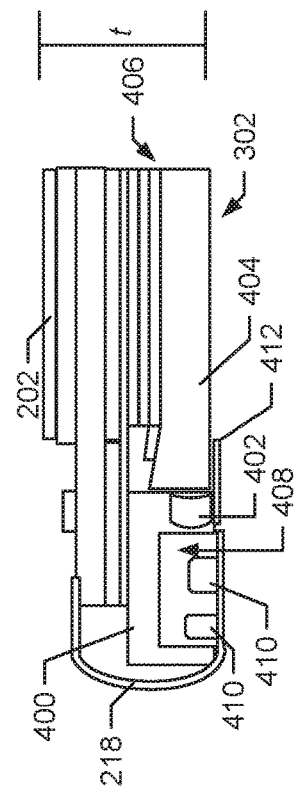

EDGE-TO-EDGE DISPLAY DEVICES AND RELATED METHODS

RELATED APPLICATION

This patent arises from a continuation of U.S. patent application Ser. No. 16/230,352 (now U.S. Pat. No. 10,782, 736), entitled "Edge-to-Edge Display Devices and Related Methods" and filed on Dec. 21, 2018. U.S. patent application Ser. No. 16/230,352 claims the benefit of, and priority to, U.S. Provisional Patent Application No. 62/633,016, entitled "Edge-to-Edge Display Devices and Related Methods" and filed on Feb. 20, 2018. U.S. patent application Ser. No. 16/230,352 and U.S. Provisional Patent Application No. 62/633,016 are hereby incorporated by reference in their entireties. Priority to U.S. patent application Ser. No. 16/230,352 and U.S. Provisional Patent Application No. 62/633,016 is hereby claimed.

FIELD OF THE DISCLOSURE

This disclosure relates generally to display devices and, more particularly, to edge-to-edge display devices and related methods.

BACKGROUND

An electronic user device such as a laptop, or tablet, or other personal computing (PC) device includes a display screen to enable a user to interact with content displayed on the screen via graphical user interfaces. The user device includes a bezel or a frame disposed around the edges of the display screen. Along with housing (e.g., a cover or lid) of the user device that houses the display screen, the bezel structurally supports the display screen when, for example, the display screen is coupled to another component such as base of a laptop including a keyboard. The bezel also protects electrical components associated with and disposed proximate to the display screen, such as printed circuit boards, source drivers, etc., from external exposure.

Screen-to-body ratio represents an amount of display screen surface relative to an amount of body surface of the electronic device. A electronic device having a high screen-to-body ratio typically includes a bezel that forms a narrow border around the display screen of the device and, thus, defines a larger display screen area that is visible to the user, as compared to a device with a smaller screen-to-body ratio.

BRIEF DESCRIPTION OF THE DRAWINGS

FIG. 2 is a schematic illustration of an example display device constructed in accordance with teachings of this disclosure.

FIG. 3 is a cross-sectional view of the example display device of FIG. 2 taken along the 3-3 line of FIG. 2.

FIG. 4 is a partial cross-sectional view of the example display device of FIGS. 2 and 3 taken along the 4-4 line of FIG. 2.

The figures are not to scale. Instead, the thickness of the layers or regions may be enlarged in the drawings. In general, the same reference numbers will be used throughout the drawing(s) and accompanying written description to refer to the same or like parts.

DETAILED DESCRIPTION

Figure 1:
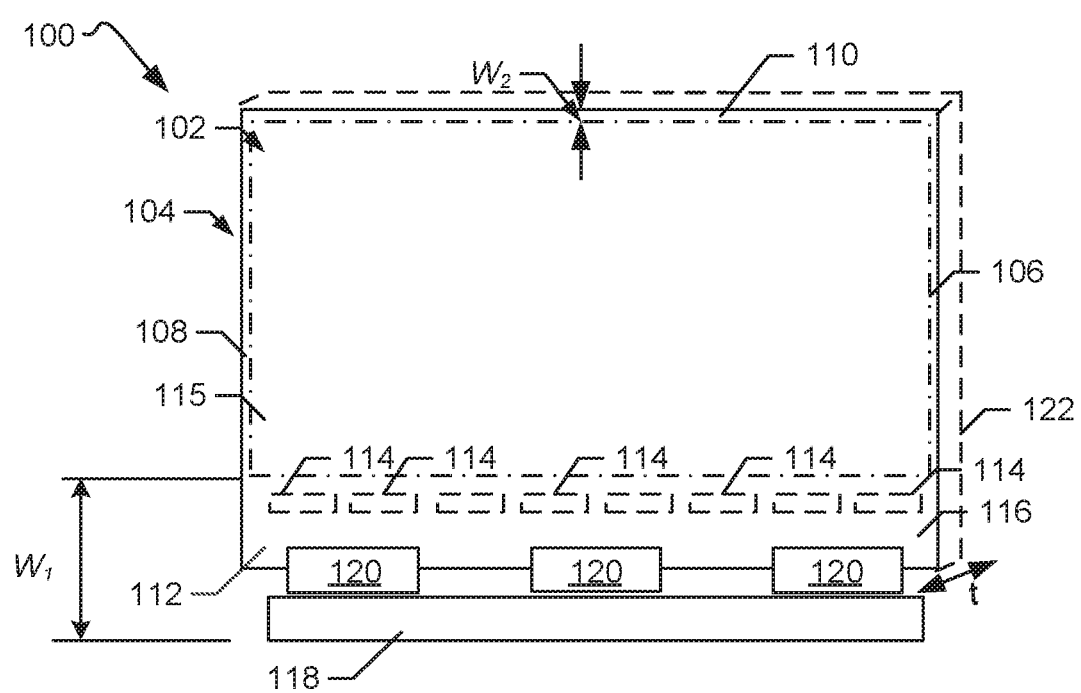
FIG. 1 is a schematic illustration of a known display device.

A display screen of an electronic user device such as a laptop, tablet, or other personal computing (PC) device enables a user to interact with content such as user applications installed on the user device, media accessed via the Internet, etc., via graphical user interfaces that are presented on the display screen. The display screen (e.g., an LCD panel) is typically surrounded by a frame, border, or bezel that defines a perimeter of the display screen. The bezel can be coupled to a housing (e.g., a cover or lid) of the user device that houses the display screen and other electronic components of a display device that includes the display screen. The bezel structurally supports the display screen by framing or holding the display screen when the display screen is, for example, used with a laptop. In some examples, the bezel covers one or more electrical components associated with the display device, such as source drivers, backlight drivers, and timing controller (TCON) chip(s) disposed on a printed circuit board (PCB) proximate to the display screen. In such examples, the bezel protects the electrical components of the display device from external exposure, prevents debris from damaging the electrical components, etc.

A bezel includes sidewalls that extend along a right side of the display screen (e.g., relative to a user viewing the display the screen), a left side of the display screen, a top of the display screen, and a bottom of the display screen. Screen-to-body ratio represents an amount of display screen surface relative to an amount of body surface of the PC device. Increasing the screen-to-body ratio can be achieved by reducing a width of one or more sidewalls of the bezel surrounding the display screen, thereby increasing an amount of the display screen that is visible to the user. For example, the widths of the top, right, and left sidewalls of the bezel may be reduced so as to give the user the appearance that the display screen extends from edge-to-edge, or put another way, is substantially bezel-less or borderless.

As mentioned above, at least a portion of the bezel, such as the bottom sidewall, may cover electrical components of the display screen, such as source driver integrated circuit(s) (IC(s)) that may be bonded to a glass substrate of the display panel and the TCON PCB. The TCON PCB may be disposed proximate to the bottom sidewall of the bezel to facilitate efficient communicative coupling with, for example, a motherboard of a laptop that may be located at a base of the laptop, or the portion including the keyboard. A bezel having a narrow bottom sidewall may not adequately cover the electrical components of the display screen. Thus, some known bezels include narrow top, right, and left sidewalls but have wider bottom sidewalls to cover the electrical components. The wider bottom sidewall limits the screen-to-body ratio that can be achieved using such bezels.

In some known user devices, the TCON PCB is disposed on the motherboard of the electronic device, which can be housed in a portion of the user device that is separate from the display screen, such as a base of a laptop). Moving the TCON PCB away from the portion of the device including the display screen may permit use of a bezel including a narrower bottom sidewall to be used to frame the display screen. However, moving the TCON PCB introduces complications with respect to routing signals between the TCON PCB and the source driver IC(s). For example, cables that communicatively couple the TCON PCB to the display screen and/or the source driver IC(s) may need to be routed through hinge(s) of the user device that secure the portion of the device including the TCON PCB to the portion of the device including the display screen. Such a routing of cables can affect signal integrity and introduce electromagnetic interference concerns.

Some other known attempts to increase the screen-to-body ratio and an edge-to-edge appearance of the display screen include adjusting a size of the TCON PCB and/or moving the TCON PCB behind the display screen within the housing of the display device. A size and/or configuration of the TCON PCB may be adjusted by using a flexible PCB to, for example, fit the TCON PCB behind the display screen or reduce a width of the TCON PCB when the TCON PCB is disposed near the bottom sidewall of the bezel. However, although the size and/or configuration of the flexible TCON PCB may be adjusted, the number of components coupled to the TCON PCB has not changed. Thus, a thickness of the TCON PCB may be increased to accommodate the active components (e.g., TCON chip(s)) and the passive components (e.g., resistors, capacitors) coupled to the PCB. An increase in the thickness of the PCB may increase a thickness of a profile of the display device (e.g., a side profile of the display device) and, thus, impact the form factor of the user device.

Disclosed herein are example bezels to be disposed about a display screen of a display device that include narrow sidewalls to increase the screen-to-body ratio of a user device that includes the display device. In some examples disclosed herein, an integrated circuit (IC) including a timing controller and a source driver (i.e., TCON embedded driver (TED) IC) is coupled to (e.g., mounted) on a glass substrate of the display screen using chip-on-glass (COG) bonding. The use of the TED IC reduces a number of PCB components of the display device as compared to display devices that include a TCON PCB. In some examples, the flexible printed circuits (FPCs) including passive components (e.g., resistors, capacitors) can be disposed within the display device without increasing the thickness of a side profile of the display device. Thus, in examples disclosed herein, a bezel having a narrow bottom sidewall can be used to increase the visible display screen area without negatively impacting the form factor of the user device and/or the operation of the device.

In some other examples disclosed herein, an IC (e.g., a TED IC) is coupled to (e.g., mounted on) an FPC via chip-on-flex bonding. In such examples, at least a portion of the FPC is disposed in a portion of a lid or cover of a user device such as a laptop that receives hinge(s) to couple the display screen to a base of the user device (e.g., a portion of a laptop including a motherboard, a keyboard, etc.). As a result, an amount of the FPC to be covered by the bottom sidewall of the bezel is reduced as compared to known display devices including TCON PCBs that are located in the hinge region of the device. Thus, a width of the bottom sidewall of the example bezels disclosed herein can be reduced and the screen-to-body ratio of the user device can be increased.

Also disclosed herein are example backlights that improve uniform distribution of light emitted by a plurality of light sources (e.g., light-emitting diodes) to illuminate a display screen of a display device. The light sources of the backlight are spaced apart from the display screen by a gap over which light emitted by the respective light sources travels and integrates to form a substantially uniform light to illuminate the display screen. In some examples disclosed herein, spacers (e.g., photo spacers) are disposed between the respective light sources. Example spacers disclosed herein include a reflective coating to facilitate the distribution of light emitted by the light sources. In examples disclosed herein, the size of the gap between the light sources and the display screen can be reduced as compared to known backlights because of the improved distribution of light due to the spacers located at the light sources. In reducing the gap between the light sources and the display screen, a thickness of a side profile of the display device can be reduced. As a result, a thickness of a portion of the bezel that covers or partially covers the sides of the display device can be reduced.

Although examples disclosed herein are primarily discussed in the context of user devices such as laptops, the example displays disclosed herein can be utilized with other electronic display devices, such as televisions, smartphones, desktop monitors, tablets, etc. As such, the discussion of display devices for laptops is for illustrative purposes only and does not limit this disclosure to use with laptops.

FIG. 1 illustrates a display device 100 known in the prior art. The known display device 100 can be used with an electronic user device such as a laptop or a tablet. The known display device 100 includes a display screen 102 (e.g., an LCD panel). A bezel 104 is disposed around the display screen 102. The bezel 104 includes a first sidewall 106 (i.e., a right sidewall relative to a user viewing the display screen 102 in the orientation illustrated in FIG. 1), a second or left sidewall 108, a third or top sidewall 110, and a fourth or bottom sidewall 112.

The display screen 102 includes a plurality of source drivers 114 coupled to (e.g., mounted on) a glass substrate 115 of the display screen 102 via, for instance, chip-on-glass bonding. As shown in FIG. 1, the source drivers 114 are disposed proximate to a portion 116 of the display screen 102 covered by the bottom sidewall 112 of the bezel 104. The display device 100 includes a timing controller (TCON) PCB board 118. The TCON PCB board 118 is communicatively coupled to the source drivers 114 via one or more flexible printed circuits (FPC(s)) 120. The TCON PCB board 118 is communicatively coupled to a motherboard of the user device that includes the display device 100, such as a laptop, via cables that extend from the display device to a base of the laptop.

As shown in FIG. 1, the sidewalls 106, 108, 110, 112 of the bezel 104 cover the portion 116 of the display screen including the source drivers 114 and the right, left, and top edges of the display screen 102. As also shown in FIG. 1, the bottom sidewall 112 has a width $W_1$ that is greater than a width $W_2$ of any of the right, left, and top sidewalls 106, 108, 110. Thus, the bottom sidewall 112 covers a greater portion of the display screen 102 than the other sidewalls 106, 108, 110. The width of the bottom sidewall 112 is increased relative to the widths of the other sidewalls 106, 108, 110 to cover the source drivers 114, the FPC(s) 120, the TCON PCB 118, etc. In FIG. 1, the width $W_1$ of the bottom sidewall 112 ranges from 7 mm to 18 mm.

The bezel 104 of FIG. 1 includes side portions 122, or portions that extend at least partially along the respective right and left sides of the display device 100 and that can couple to a housing (e.g., a backing or cover) of the display device 100. One of the side portions 122 is shown in FIG. 1. In FIG. 1, a thickness t of a side portion 122 of the bezel 104 is about 4.5 mm. The side portion(s) 122 of the bezel 104 at least partially cover the TCON PCB 118. The side portion(s) 122 of the bezel 104 may also cover or partially electrical components of the known display device 100 disposed behind the display screen 102, such as a backlight (e.g., including LED light sources, light pipes, optical films).

FIG. 2 illustrates an example user device 200 including an example display device 201 constructed in accordance with teachings of this disclosure. The example user device 200 is a laptop, however, the user device 200 can include other user devices such as an electronic tablet (e.g., an electronic tablet that can be coupled to one or more keyboards, docketing stations, etc.). The example display device 201 of FIG. 2 includes a display screen 202 (e.g., an LCD panel). A bezel 204 is disposed around the display screen 202. The example bezel 204 of FIG. 2 includes a first sidewall 206 (i.e., a right sidewall relative to a user viewing the display screen 202 in the orientation illustrated in FIG. 2), a second or left sidewall 208, a third or top sidewall 210, and a fourth or bottom sidewall 212. As shown in FIG. 2, the sidewalls 206, 208, 210, 212 form a frame about the display screen 202.

The bezel 204 of FIG. 2 includes side portions 209 that at least partially extend along respective right and left sides of the display device 201. For illustrative purposes, one of the side portions 209 of the bezel is shown in FIG. 2. In the example FIG. 2, the side portions 209 of the bezel 204 can be coupled (e.g., via mechanical or chemical fastener(s)) to a housing (e.g., a lid or a cover) that houses the display screen 202 and serves as a protective cover for the display device 201. The example display device 201 of FIG. 2 is coupled to a base 211 of, the user device 200 via one or more hinges 213. In some examples, the bottom sidewall 212 of the bezel 204 includes openings to accommodate the hinge (s) 213. In other some examples, the bottom sidewall 212 of the bezel 204 does not include opening(s) for hinge(s) (e.g., when used with some electronic tablets, when used with laptops having various hinge designs, etc.). In some such examples, the bottom sidewall 212 of the bezel 204 is disposed above (i.e., entirely above) the hinges to avoid interfering with the hinge(s) of the laptop.

In the example of FIG. 2, one or more integrated circuits (IC(s)) 214 are coupled to (e.g., mounted on) a glass substrate 215 of the display screen 202. In the example of FIG. 2, the IC(s) 214 are TCON embedded driver(s) including TCON drivers and source drivers (i.e., TED IC(s)). As shown in the example of FIG. 2, the TED IC(s) 214 are coupled to a portion 216 of the glass substrate 215 that is proximate to the bottom sidewall 212 of the bezel 204. In the example of FIG. 2, the TED IC(s) 214 are coupled or bonded to the glass substrate 215 using chip-on-glass (COG) bonding. For example, the TED IC(s) 214 may be bonded to the glass substrate 215 using anisotropic conductive film.

The example display device 201 of FIG. 2 includes one or more flexible printed circuits (FPC(s)) 218. In the example of FIG. 2, the FPC(s) 218 include passive components such as resistors and capacitors. These passive components provide functions such as power delivery, power conditioning, facilitating communication between a motherboard 219 of the user device 200 and the TED IC(s) and/or other electrical components of the display device 201, etc.

As compared to the known display device 100 of FIG. 1 including the TCON PCB 118, in the example of FIG. 2, the FPC(s) 218 do not include the TCON chips. Rather, the TED IC(s) 214 include the TCON drivers and, thus, the example display device 201 of FIG. 2 does not include a separate TCON PCB as in the known display device 100 of FIG. 1. Therefore, a size (e.g., a width) of the FPC(s) 218 of FIG. 2 is reduced as compared to the TCON PCB 118 of FIG. 1. As a result, a width W of the bottom sidewall 212 of the bezel 204 is less than a width of the bottom sidewall 112 of the bezel 104 in the known display device 100 of FIG. 1. In particular, the width of the bottom sidewall 212 of bezel 204 of FIG. 2 is reduced as compared to the bezel 104 of FIG. 1 because in the example of FIG. 2, there are fewer electrical components to cover with the bottom sidewall 212. Additionally or alternatively, the electrical components that are to be covered by the bottom sidewall 212 (e.g., the FPC(s) 218) are reduced in size (e.g., width, thickness) as compared to the electrical components of the known display device 100 of FIG. 1 (e.g., the TCON PCB 118). For example, the width W of the bottom sidewall 212 of the bezel 204 of FIG. 2 can be approximately 5 mm. In some examples, the width of the bottom sidewall 212 and widths of one or more of the right sidewall 206, the left sidewall 208, and/or the top sidewall 210 are the same or substantially the same. In some examples, the widths of each of the right sidewall 206, the left sidewall 208, the top sidewall 210, and the bottom sidewall 212 are the same or substantially the same.

In the example of FIG. 2, the COG bonding of the TED IC(s) 214 to the display glass substrate 215 reduces a number of PCB components of the display device 201 and, thus, facilitates a reduction in a width of the bottom sidewall 212 of the bezel 204 as compared to the bezel 104 of the known display device 100 of FIG. 1. As result, an increased amount of the display screen 202 is visible to the user. The reduction in the width of the bottom sidewall 212 of the bezel 204 of FIG. 2 increases a screen-to-body ratio of user device 200 and provides an appearance of an edge-to-edge display screen.

FIG. 3 is a cross-sectional view of the example display device 201 of FIG. 2 taken along the 3-3 line of FIG. 2. For illustrative purposes, the bezel 204 is not shown in FIG. 3. As illustrated in FIG. 3, the example display device 201 includes a backlight 302 disposed proximate to a backside 304 of the display screen 202, or a side of the display screen 202 that is not visible to the user. FIG. 3 also shows one of the TED ICs 214 of FIG. 2 coupled to the display screen 202 via COG bonding.

As discussed above, in the example of FIG. 2, the FPC(s) 218 include passive components such as resistors and capacitors, but do not include TCON chips, which are instead included in the TED IC(s) 214. A thickness of a side profile of the display device 201 can be defined by placement and/or size of PCB board(s), FPC(s), etc. As disclosed herein, in the example of FIGS. 2 and 3, the FPC(s) 218 are disposed proximate to a light guide frame (FIG. 4) of the backlight 302 to reduce a thickness of the sides of the display device 201. Reducing a thickness of the sides of the display device allows a thickness of the side portion(s) 209 of the bezel 204 of FIG. 2 that at least partially extend along the sides of the display device 201 to be reduced.

FIG. 4 is a partial, cross-sectional view of the example display device 201 of FIGS. 2 and 3 taken along the 4-4 line of FIG. 2 and showing a portion of the backlight 302 of FIG. 3. For illustrative purposes, the bezel 204 is not shown in FIG. 4. The example backlight 302 includes a light guide frame 400 that houses at least one light source 402 (e.g., an LED). The light guide frame 400 can be made of, for example, aluminum. The backlight 302 includes a light guide pipe 404 and a plurality of optical films 406 to distribute the light emitted by the light source 402 to illuminate the display screen 202.

In the example of FIG. 4, the light guide frame 400 includes a cavity 408 defined therein. The cavity 408 can be formed in the light guide frame 400 during manufacture of the light guide frame 400 via, for example, extrusion. As illustrated in FIG. 4, the FPC 218 of the display device 201 is positioned relative to the backlight 302 such that one or more PCB components 410 (e.g., resistors, capacitors, or electrical components) of the FPC 218 is at least partially disposed in the cavity 408. Thus, the PCB components 410 of the FPC 218 are stored within cavity 408 of the light guide frame of the example backlight 302 rather than consuming space elsewhere in the display device 201. The placement of the PCB components 410 of the FPC 218 in the cavity 408 of the light guide frame 400 maximizes use of available space in the cavity 408. As a result of the storage of the PCB components 410 within the cavity 408, a thickness t of the side profile of the display device 201 is reduced as compared to the known display device 100 of FIG. 1 in which the PCB components are located, for instance, behind the display screen but not within a cavity of other display device components such as the light guide frame. Accordingly, a thickness of the side portion(s) 209 of the bezel 204 required to cover components of the display device 201 such as the FPC 218 is reduced as compared to the bezel 104 of the known display device 100 of FIG. 1. For example, the side portion(s) 209 of the bezel 204 can have a thickness of 2 mm or less. Thus, the example display device 201 of FIG. 2 provides for a reduction in the width of the bottom sidewall 212 of the bezel 204 and a reduction in the thickness of the side portion(s) 209 of the bezel 204 that are used at least partially to cover the sides of the display device 201. The reduction in the width of the bottom sidewall 212 increases an area of the display screen 202 visible to the user. Further, the reduction in the width of the bottom sidewall 212 and the reduction in the thickness of the side portion 209 of the bezel 204 reduces a form factor of the display device 201.

In some examples, the light source 402 of FIG. 4 is coupled to a FPC 412. As shown in FIG. 4, the FPC 412 can be a different FPC than the FPC 218 that includes the passive PCB components 410. In the example of FIG. 4, the FPC 412 to which the light source 402 is coupled is disposed relative to the light guide frame 400 such that the light source 402 is disposed proximate to the light guide pipe 404 to illuminate the display screen 202. In other examples, the light source 402 is coupled to the FPC 218 in addition to the passive PCB components 410 that are coupled to the FPC 218. In such examples, a length of the FPC 218 can be extended to relative to the example shown in FIG. 4 to enable the light source 402 to be coupled to the FPC 218 and to be disposed proximate to the light guide pipe 404.

Figure 5:
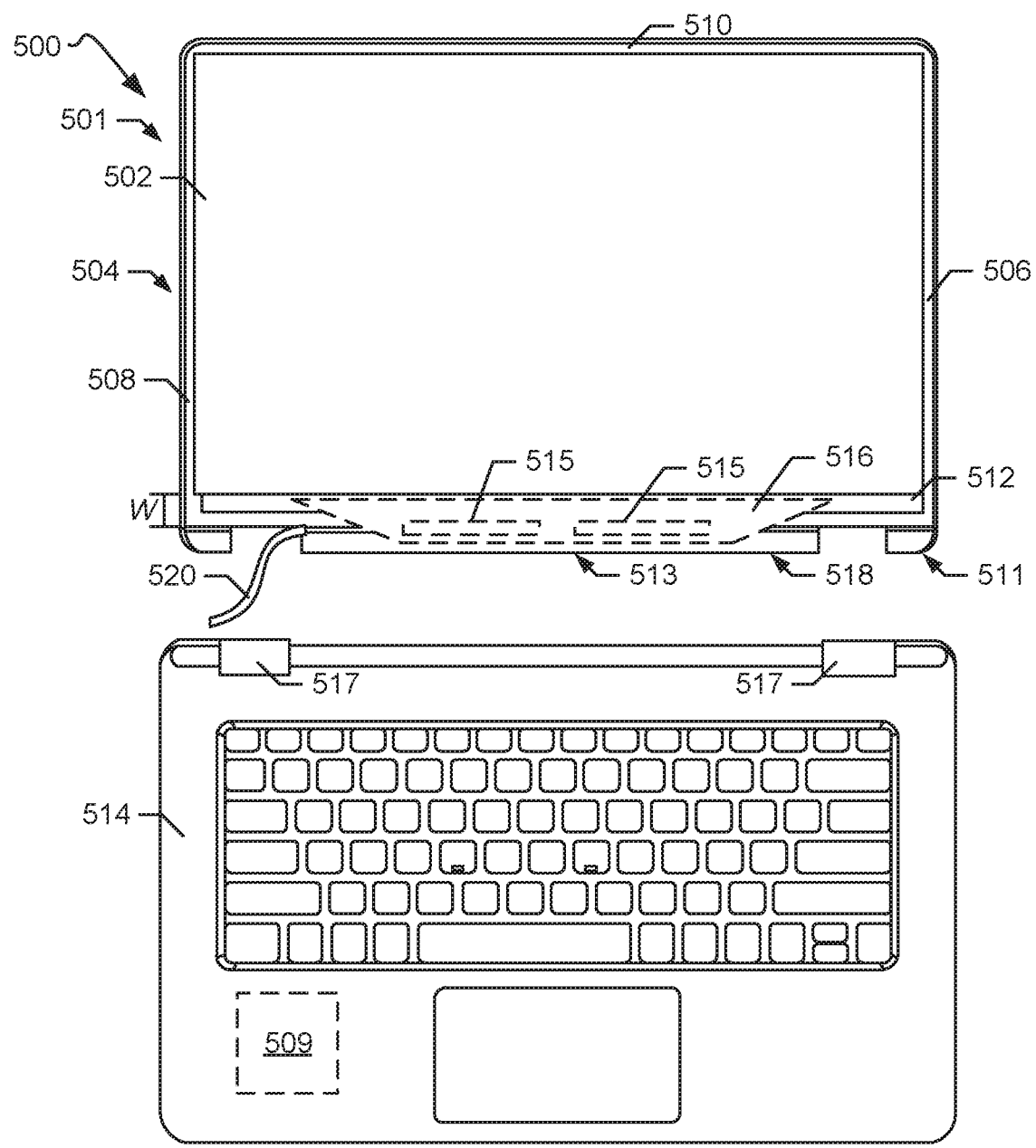
FIG. 5 is a schematic illustration of another example display device constructed in accordance with teachings of this disclosure.

FIG. 5 illustrates an example user device 500 including another example display device 501 in accordance with teachings of this disclosure. In the example of FIG. 5, the user device 500 is a laptop, however, the example display device 501 can be used with other types of user devices (e.g., a tablet, a smartphone). The example display device 501 of FIG. 5 includes a display screen 502 (e.g., an LCD panel). A bezel 504 is disposed around the display screen 502. The bezel 504 of FIG. 5 is similar to the example bezel 204 of FIG. 2. For instance, the bezel 504 of FIG. 5 includes a first sidewall 506 (i.e., a right sidewall relative to a user viewing the display screen 502 in the orientation illustrated in FIG. 5), a second or left sidewall 508, a third or top sidewall 510, and a fourth or bottom sidewall 512. As shown in FIG. 5, the sidewalls 506, 508, 510, 512 form a frame about the display screen 502.

In the example of FIG. 5, the bezel 504 is coupled (e.g., via mechanical or chemical fastener(s)) to a housing 511 (e.g., a lid or cover) that houses the display device 501 and serves as a protective cover for the display device 501 (e.g., when the laptop is in a folded position). The housing 511 includes a hinge receiving region 513. In FIG. 5, the display device 501 is coupled to a base 514 of the user device 500 (e.g., a portion of the user device 500 including a motherboard 509) via one or more hinges 517. At least a portion of the hinge(s) 517 are received in the hinge receiving region 513 of the housing 511 to couple the display device 501 to the base 514. In the example of FIG. 5, the bottom sidewall 512 of the bezel 504 is disposed above (i.e., entirely above) the hinge(s) 517 so as not to interfere with the hinge(s) 517.

In the example of FIG. 5, one or more integrated circuits (IC(s)) 515 are coupled to (e.g., mounted on) an FPC 516 of the display device 501. In the example of FIG. 5, the IC(s) 515 are TCON embedded drivers including TCON drivers and source drivers. In the example of FIG. 5, the TED IC(s) 515 are coupled to (e.g., mounted on) the FPC 516 using chip-on-flex (COF) bonding. For example, COF bonding can include a die attach process in which the TED IC(s) 515 are attached to the flexible substrate of the FPC 516 and a wire bonding process to provide for electrical connections between the TED IC(s) 515 and the FPC 516.

As illustrated in FIG. 5, the FPC 516 is disposed proximate to the bottom sidewall 512 of the bezel 504. In the example of FIG. 5, at least a portion of the FPC 516 is disposed in a cavity 518 formed in the hinge receiving region 513 of the housing 511 of the display device 501. In FIG. 5, a cable 520 is routed to extend from the cavity 518 of the hinge receiving region 513 of the housing 511 to communicatively couple the FPC 516 to the motherboard 509 of the user device 500 located at the base 514 of the user device 500.

As a result of the disposal of a portion of the FPC 516 in the hinge receiving region 513 of the housing 511, the amount of the FPC 516 that is to be covered by the bottom sidewall 512 of the bezel 504 is reduced as compared to if the bottom sidewall 512 was to cover all or substantially all of the FPC 516. For example, the bottom sidewall 512 covers a portion of the FPC 516 that is external to or not disposed in the cavity 518 of the hinge receiving region 513 of the housing 511. In some examples, the bottom sidewall 512 covers at least a portion of the TED IC(s) 515. In other examples, the TED IC(s) 515 are disposed in the cavity 518 and such that the bottom sidewall 512 covers a portion the FPC 516 that does not include the TED IC(s) 515. Thus, a width W of the bottom sidewall 512 of FIG. 5 is reduced as compared to the width of the bottom sidewall 112 of the bezel 104 of the known display device 100 of FIG. 1. In some examples, the width W of the bottom sidewall 512 of FIG. 5 is approximately 3 mm. Thus, the example display device 501 of FIG. 5 provides for an increased a screen-to-body ratio of the user device 500. In some examples, the width of the bottom sidewall 512 and widths of one or more of the right sidewall 506, the left sidewall 508, and/or the top sidewall 510 are the same or substantially the same. In some examples, the widths of each of the right sidewall 506, the left sidewall 508, the top sidewall 510, and the bottom sidewall 512 are the same or substantially the same.

Thus, the example display devices 201, 501 of FIGS. 2-5 include bezels having bottom sidewalls with substantially reduced widths as compared to known bezels (e.g., the bezel 104 of FIG. 1). As a result of the use of TED IC(s) 214, 515 and bonding processes such as COG and COF, the number of PCB components of the display devices 201, 501 is reduced, which provides for increased flexibility in adjusting the position of the FPCs and, accordingly, enables a reduction in the width of the bottom sidewalls 212, 512 of the bezels 204, 504. In some examples, as in the example display device 501 of FIG. 5, components of the user device such as the hinge receiving region 513 of the laptop housing or lid 511 receive a portion of the FPC. As a result, the bottom sidewall 512 of the bezel 504 covers less of the FPC and, thus, a width of the bottom sidewall 512 can be reduced. Accordingly, the example display devices 201, 501 facilitate the appearance of an edge-to-edge display screen or a substantially bezel-less display screen. In other examples disclosed herein, such as in the display device 201 of FIGS. 2-4, components of the display device, such as the light guide frame 400, are used to store FPC components, thereby enabling a thickness of the side profile of the display device to be reduced and decreasing a form factor of the user device.

Figure 6:
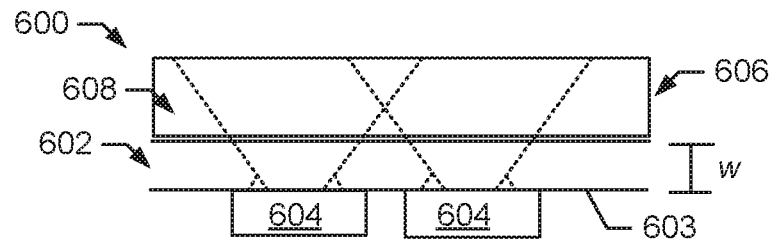
FIG. 6 is a schematic illustration of a known backlight of a display device.

In some examples, in addition to or as an alternative to the PCB component(s) discussed in connection with FIGS. 2-5 that enable a width of the bottom sidewall of the bezel to be reduced (e.g., the use of TED ICs, the positioning of the FPCs), a backlight of the display device can facilitate reductions in a thickness of the side portions of the bezel (e.g., the side portion(s) 209 of FIG. 2) that at least partially cover the sides of the display device. FIG. 6 illustrates a known backlight 600 of a display device. As shown in FIG. 6, a gap 602 is defined between a light guide panel 603, which includes LED light sources 604 coupled thereto, and a display screen 606 of the display device. The gap 602 provides an area for light emitted by the respective LED light sources 604 to integrate and form a uniform or substantially uninform light that illuminates the display screen 606, defining an active area 608 or a viewable area of the display screen 606. The gap 602 enables the light emitted by the respective LED light sources 604 to integrate to reduce instance of hot spots or irregularities in the light distribution that may cause portions of the display screen 606 to appear brighter than other portions.

In example backlights disclosed herein, a width of the gap between the light guide panel and the display screen is reduced as compared to the width w of the gap 602 of the known backlight of FIG. 6. As disclosed herein, a decrease in the size of the gap reduces a thickness of the display profile and thus, allows a thickness of the side portions of the bezel to be reduced as compared to display device including larger gaps between the light guide panel and the display screen. Further, in examples disclosed herein, the smaller gap size allows the light sources to be located closer to the display screen. As a result, an amount or density of the light that illuminates the edges of the display screen is increased, thereby increasing an active area of the LCD display screen and allowing more of the display screen to be viewed by a user. The increased viewable or active area of the display screen further provides for the appearance of an edge-to-edge display screen when used with the, for instance, the example bezels 204, 504 of FIGS. 2-5.

Figure 7:
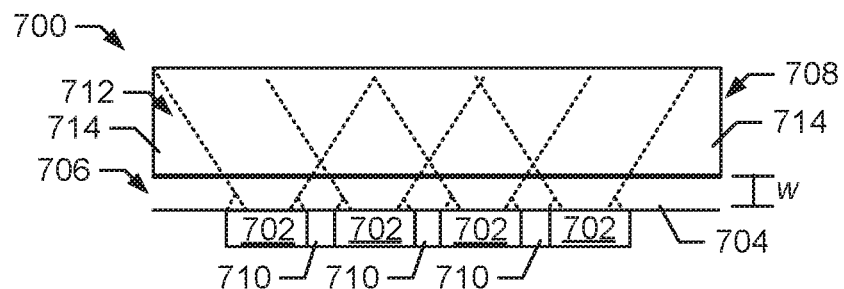
FIG. 7 is a schematic illustration of an example backlight of a display device constructed in accordance with teachings of this disclosure.

FIG. 7 illustrates an example backlight 700 for use with a display device (e.g., the example display devices 201, 501 of FIGS. 2-5) in accordance with teachings of this disclosure. The backlight 700 of FIG. 7 includes a plurality of lights sources 702 coupled to a light guide panel 704. The light sources 702 can include one-chip LEDs. The example backlight 700 can include additional or fewer light sources 702 than illustrated in FIG. 7. In FIG. 7, a gap 706 is defined between the light guide panel 704 and a display screen 708 (e.g., an LCD panel) of the display device.

In the example of FIG. 7, spacers 710 (e.g., photo spacers made of, for instance, silicon dioxide) are disposed between the respective light sources 702. The example spacers 710 include reflective coatings (e.g., white paint) to help diffuse the light and improve uniformity of the light emitted by the respective light sources 702. Therefore, a distance of the gap 706 over which the light emitted by the respective light sources 702 travels before integrating and forming a substantially uniform light is reduced as compared to backlights that do not include the spacers 710 to facilitate distribution of the light emitted by each of the light sources 702. Thus, a width w of the gap 706 can be decreased as compared to the width of the gap 602 in the known backlight 600 of FIG. 6. Further, as a result of the reduced size of the gap 706, the light sources 702 are located closer to the display screen 708. As a result, an area of the display screen 708 that is illuminated by the backlight 700, i.e., an active area 712, is increased. The example lights sources 702 of FIG. 7 increase an amount or a density of the light that illuminates the edges 714 of the display screen 708 due to the increased proximity of the light sources 702 to the display screen 708. In particular, distribution of the light at the edges 714 of the display screen 708 is increased in the example of FIG. 7 as compared to when the light sources are disposed further away from the display screen, as in the known backlight 600 of FIG. 6. The expanded active area 712 of the display screen 708 improves viewing of the display screen 708 in examples in which the bezel of a user device (e.g., the bezels 204, 504 of FIGS. 2-5) includes narrow sidewalls and, thus, the viewable area of the display screen is increased, as in edge-to-edge display screens.

Figure 8:
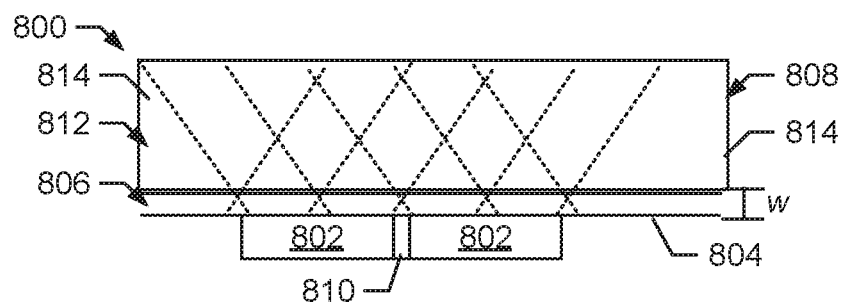
FIG. 8 is a schematic illustration of another example backlight of a display device constructed in accordance with teachings of this disclosure.

FIG. 8 illustrates an example backlight 800 including a one or more two-chip (or n chip) LED lights sources 802 and a light guide panel 804. The example backlight 800 can include additional or fewer light sources 802 than illustrated in FIG. 8. In FIG. 8, a gap 806 is defined between the light guide panel 804 and a display screen 808 (e.g., LCD panel) of the display device. In the example of FIG. 8, a spacer 810 (e.g., a photo spacer) including a reflective coating (e.g., white paint) is disposed between the LED light sources 802. As discussed above in connection with FIG. 7, the spacer 810 helps to diffuse and improve uniformity of the light emitted by the respective LED light sources 802. As a result, a width w of the gap 806 of the example backlight 800 of FIG. 8 is reduced as compared to backlights that do not include the spacer 810 to diffuse the light emitted by the light(s) of the backlight. Further, the use of the two-chip (or n chip) LED light source(s) 802 increases an amount of a density of the light that illuminates the edges 814 of the display screen 808. Thus, a viewable or active area 812 of the display screen 808 is increased as compared to the active area 608 of the display screen 606 in FIG. 6.

The example backlights 700, 800 of FIGS. 7 and/or 8 are not limited to backlights including the light sources 702, 802 and/or spacers 710, 810 of FIGS. 7 and 8. Other arrangements of the light sources, such as a string of mini LED lights can be used to improve light distribution and reduce a width of the gap between the light sources and the display screen and, thus, reduce a width of the display device profile.

Figure 9:
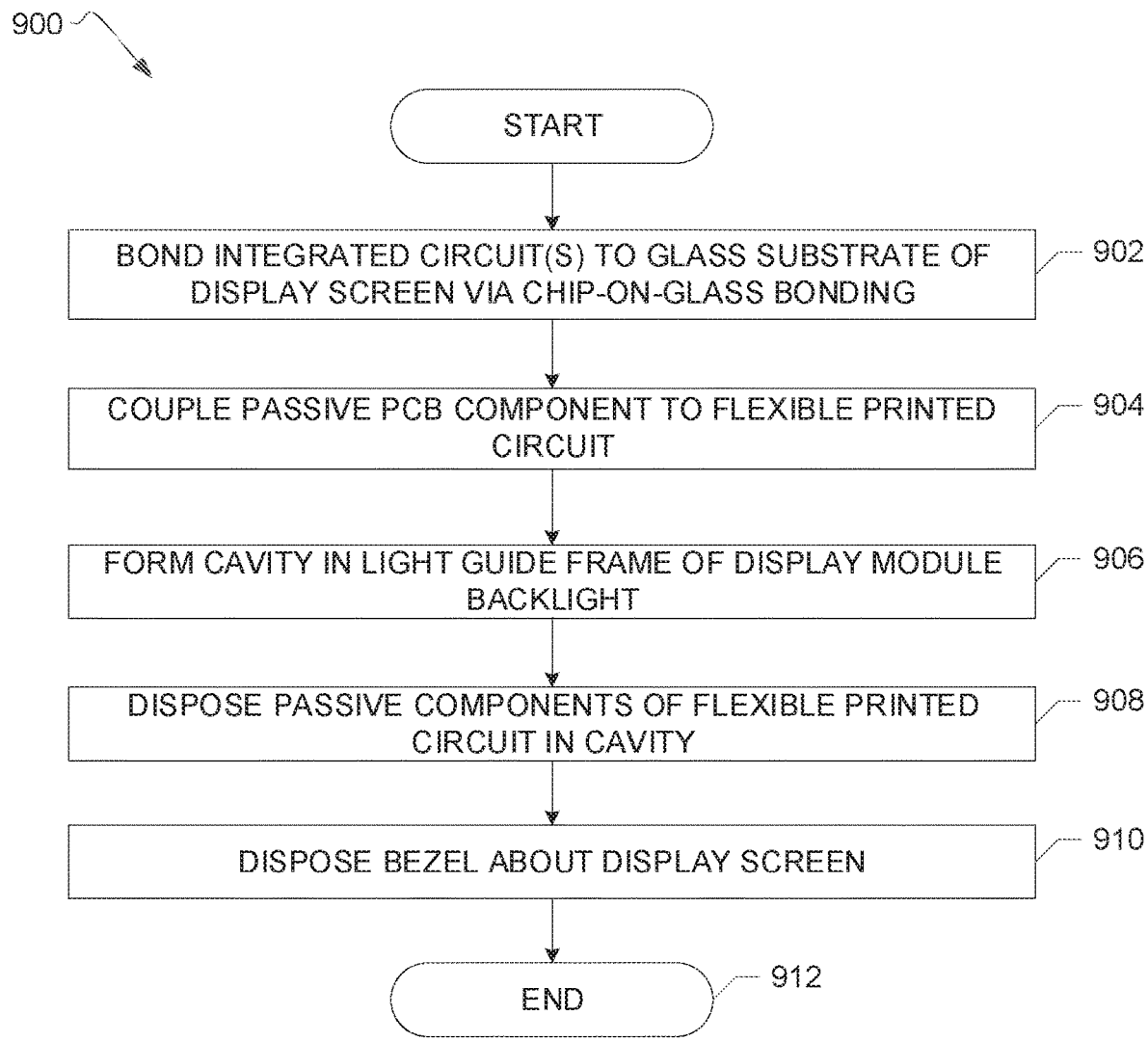
FIG. 9 is a flowchart of an example method to manufacture the example display device of FIGS. 2-4.

FIG. 9 is a flowchart of an example method 900 for manufacturing a display device such as the example display device 201 of FIGS. 2-4. At block 902, the IC(s) 214 (e.g., TCON embedded (TED) IC(s)) are bonded to the glass substrate 215 of the display screen 202 of the example display device 201. In the example method 900 of FIG. 9, the TED IC(s) 214 are bonded to the glass substrate 215 using chip-on-glass bonding.

At block 904, passive PCB components 410 such as resistors and capacitors are coupled to the flexible printed circuit (FPC) 218. The FPC 218 and the passive PCB components 410 facilitate communication between the TED IC(s) 214 and a motherboard 219 of a user device including the example display device 201 (e.g., the user device 200 of FIG. 2).

At block 906, a cavity 408 is in formed in the light guide frame 400 of the backlight 302 of the example display device 201 of FIGS. 2-4. In some examples, the cavity 408 of the light guide frame 400 is formed prior to the coupling of, for example, the light source 402 to the light guide frame 400. The cavity 408 can be formed in the light guide frame 400 via, for example, an extrusion process during manufacturing of the light guide frame 400.

At block 908, the FPC 218 is positioned relative to the backlight 302 such that the passive PCB components 410 of the FPC 218 are at least partially disposed in the cavity 408 of the light guide frame 400, thereby reducing a thickness of a profile (e.g., a side profile) and/or a form factor of the example display device 201 when assembled.

At block 910, the bezel 204 is disposed about the display screen 202 to frame the display screen 202 (e.g., by coupling the bezel 204 to a lid or cover of the user device 200). As discussed above, a bottom sidewall 212 of the bezel 204 has a reduced width as compared to bezels of known display devices, thereby increasing a viewable area of the display screen 202 and a screen-to-body ratio of the user device including the display device 201.

Figure 10:
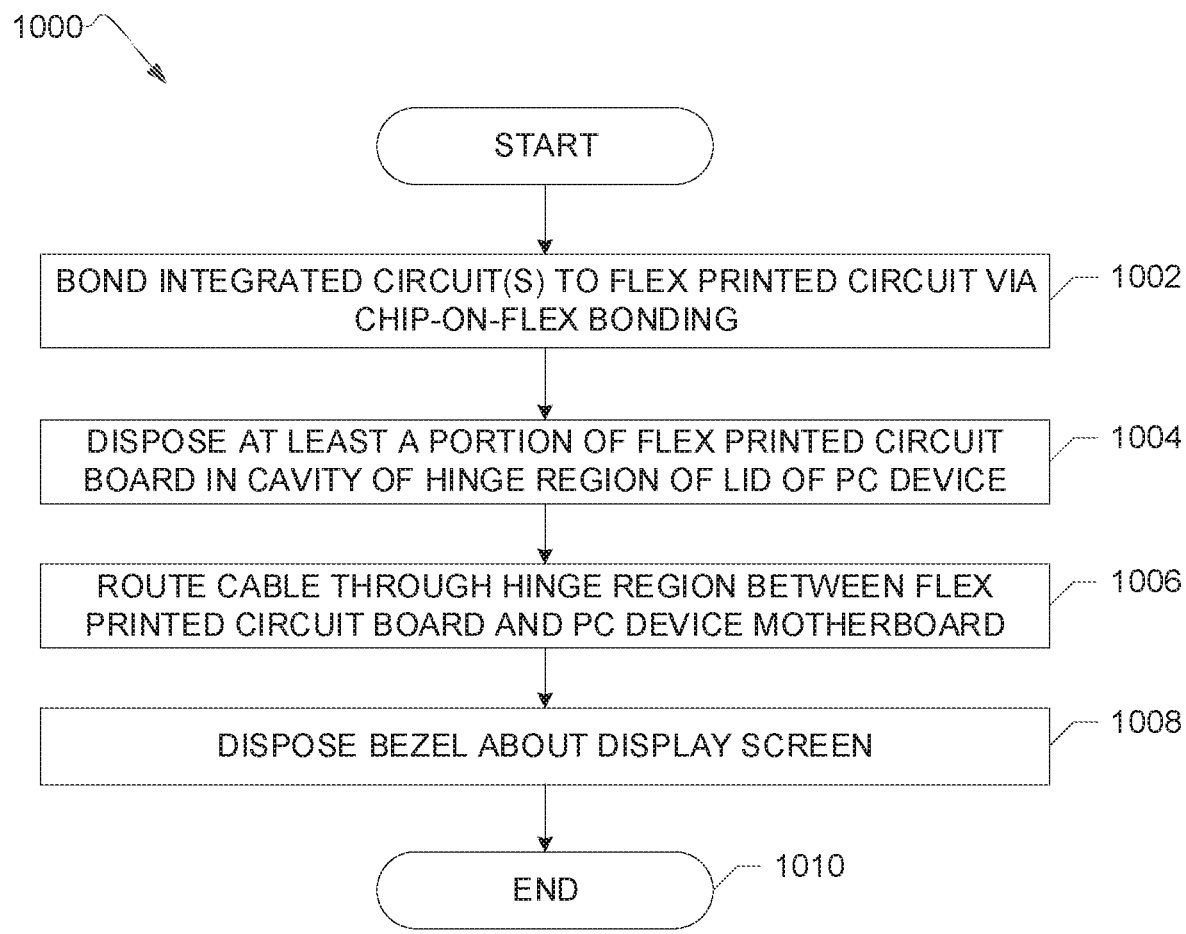
FIG. 10 is a flowchart of an example method to manufacture the example display device of FIG. 5.

FIG. 10 is a flowchart of an example method 1000 for manufacturing a display device such as the example display device 501 of FIG. 5. At block 1002, the IC(s) 515 (e.g., TCON embedded (TED) IC(s)) are bonded to the flexible printed circuit (FPC) 516 of the example display device 501. In the example method 1000 of FIG. 10, the TED IC(s) 515 are bonded to the FPC 516 using chip-on-flex bonding.

At block 1004, at least a portion of the FPC 516 is disposed in a cavity 518 of the hinge receiving region 513 of a housing 511 (e.g., lid or cover) of the display device 501 of FIG. 5. At block 1006, a cable 520 is routed through the hinge receiving region 513 of the housing 511 to communicatively couple the FPC 516 to a motherboard 509 located in at the base 514 of the user device 500.

At block 1008, the bezel 504 is disposed about the display screen 502 to frame the display screen 502 (e.g., by coupling the bezel 504 to the housing 511 of the user device 500). As discussed above, a bottom sidewall 512 of the bezel 504 has a reduced width as compared to bezels of known display devices, thereby increasing a viewable area of the display screen 502 and a screen-to-body ratio of the user device 500 including the display device 501.

Although the example methods 900, 1000 are described with reference to the flowcharts illustrated in FIGS. 9 and 10, many other methods of manufacturing the example display device 201 of FIGS. 2-4 and/or the example display device 501 of FIG. 5 may alternatively be used. For example, the order of execution of the blocks may be changed, and/or some of the blocks described may be changed, eliminated, or combined. Similarly, additional operations may be included in the manufacturing process before, in between, or after the blocks shown in FIGS. 9 and/or 10.

From the foregoing, it will be appreciated that example apparatus, articles of manufacture, and methods have been disclosed herein to reduce a width of a bezel or frame surrounding a display screen of an electronic user device and, as a result, increase a screen-to-body ratio of the user device. In examples disclosed herein, bonding techniques such as COG and COF bonding are used to mount TED IC(s) on substrates such as a glass substrate of a display screen (e.g., LCD panel) or a flexible printed circuit. Examples disclosed herein reduce a number of PCB components of the display device, which enables a width of a sidewall or border of the bezel (e.g., a bottom border of the bezel) covering the electrical components of the display device to be reduced. As a result of the reduced border sizes that can be used with the example display devices disclosed herein, an edge-to-edge display is substantially achieved relative to each of the borders of the bezel.

The following paragraphs provide various examples disclosed herein.

Example 1 includes a display device including a display screen and a backlight including a light guide frame defining a cavity therein. The example display device includes an integrated circuit coupled to the display screen. The example display device includes a flexible printed circuit in communication with the integrated circuit and including an electrical component coupled thereto. The electrical component is at least partially disposed in the cavity of the light guide frame.

Example 2 includes the display device as defined in example 1, further including a bezel disposed about the display screen, the bezel including a first sidewall, a second sidewall, a third sidewall, and a fourth sidewall, a width of each of the first, second, third, and fourth sidewalls being the same.

Example 3 includes the display device as defined in example 1, wherein the flexible printed circuit is a first flexible printed circuit and the backlight includes a second flexible print circuit disposed proximate to the first flexible printed circuit and the light guide frame.

Example 4 includes the display device as defined in example 1, wherein the integrated circuit is a timing controller embedded driver integrated circuit.

Example 5 includes the display device as defined in example 1, wherein the backlight includes a first light source, a second light source, and a spacer disposed between the first light source and the second light source, the spacer including a reflective coating.

Example 6 includes the display device as defined in example 1, wherein a portion of the flexible printed circuit is external relative to the cavity.

Example 7 includes the display device as defined in example 1, wherein the electrical component includes one or more of a resistor or a capacitor.

Example 8 includes the display device as defined in examples 1 or 4, wherein the integrated circuit is coupled to the display screen via chip-on-glass bonding.

Example 9 includes a display device including a display screen and a cover. The display screen is coupled to the cover. The cover includes a cavity. The display device includes a flexible printed circuit. The display device includes an integrated circuit coupled to the flexible printed circuit. A first portion of the flexible printed circuit is disposed in the cavity. The display device includes a bezel disposed about the display screen. The bezel is to cover a second portion of the flexible printed circuit.

Example 10 includes the display device as defined in example 9, wherein the second portion of the flexible printed circuit external to the cavity.

Example 11 includes the display device as defined in example 9, wherein the cover is to couple to a base of a user device via a hinge to secure the display screen to the base, the cavity to be disposed proximate to the hinge when the display screen is coupled to the base.

Example 12 includes the display device as defined in example 9, wherein the integrated circuit is coupled to the flexible printed circuit via chip-on-flex bonding.

Example 13 includes the display device as defined in examples 9 or 12, wherein the integrated circuit is a timing controller embedded driver integrated circuit.

Example 14 includes the display device as defined in example 9, further including a backlight, the backlight including a first light source, a second light source, and a spacer disposed between the first light source and the second light source, the spacer including a reflective coating.

Example 15 includes an electronic device including a base, a display screen, and a housing to support the display screen. The housing is coupled to the base. The electronic device includes a flexible printed circuit disposed in the housing. The electronic device includes an integrated circuit coupled to one of the display screen or the flexible printed circuit. The electronic device includes a bezel disposed about the display screen. The bezel is to cover at least a portion of the flexible printed circuit.

Example 16 includes the electronic device as defined in example 15, wherein the housing includes a cavity defined therein, at least a portion of the flexible printed circuit disposed in the housing, and wherein the integrated circuit is coupled to the flexible printed circuit.

Example 17 includes the electronic device as defined in example 16, further including a hinge to couple the housing to the base, the cavity disposed proximate to the hinge when the housing is coupled to the base.

Example 18 includes the electronic device as defined in example 16, further including a cable extending between the flexible printed circuit and the base.

Example 19 includes the electronic device as defined in example 15, wherein the integrated circuit is coupled to the display screen, the bezel to cover the integrated circuit.

Example 20 includes the electronic device as defined in example 19, further including a backlight disposed in the housing, the backlight including a light guide frame, at least a portion of an electrical component of the flexible printed circuit disposed in the light guide frame.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An electronic display device comprising:
   a housing;
   a display screen supported by the housing;
   a panel carried by the housing; and
   a backlight including:
     a first light source coupled to the panel;
     a second light source coupled to the panel, the second light source spaced apart from the first light source; and
     a first spacer disposed between the first light source and the second light source, the first spacer including a reflective coating.

2. The electronic display device of claim 1, further including:
   a third light source coupled to the panel, the third light source spaced apart from the second light source; and
   a second spacer disposed between the second light source and the third light source, the second spacer including the reflective coating.

3. The electronic display device of claim 1, wherein the panel and the display screen define a gap therebetween, the reflective coating of the first spacer to diffuse light emitted by one or more of the first light source or the second light source over the gap.

4. The electronic display device of claim 1, wherein the first light source is disposed proximate to an edge of the display screen, at least a portion of light emitted by the first light source to be distributed to the edge of the display screen.

5. The electronic display device of claim 1, wherein the first light source is a single chip light emitting diode and the second light source is a single chip light emitting diode.

6. The electronic display device of claim 1, wherein the first light source is a two-chip light emitting diode and the second light source is a two-chip light emitting diode.

7. The electronic display device of claim 1, wherein the reflective coating includes paint.

8. The electronic display device of claim 1, wherein the first spacer includes silicon dioxide.

9. An apparatus comprising:
   a display screen;

a panel, a gap defined between the panel and the display screen;

a first light source coupled to the panel;

a second light source coupled to the panel, the second light source spaced apart from the first light source, light emitted by one or more of the first light source and the second light source to be emitted over the gap; and a protrusion coupled to the panel, the protrusion disposed between the first light source and the second light source, the protrusion including a reflective coating.

10. The apparatus of claim 9, wherein the protrusion is a first protrusion and further including a third light source coupled to the panel, the third light source spaced apart from the first light source and the second light source, a second protrusion disposed between the second light source and the third light source, the second protrusion including the reflective coating.

11. The apparatus of claim 9, wherein the first light source is a single chip light emitting diode and the second light source is a single chip light emitting diode.

12. The apparatus of claim 9, wherein the first light source is a two-chip light emitting diode and the second light source is a two-chip light emitting diode.

13. The apparatus of claim 9, wherein the protrusion includes silicon dioxide.

14. A display comprising:
a display screen; and
a backlight, the backlight including:
a first light source;
a second light source; and
means for diffusing light, the means for diffusing disposed between the first light source and the second light source.

15. The display of claim 14, wherein the means for diffusing includes a photo spacer.

16. The display of claim 15, wherein the means for diffusing includes a protrusion having a reflective coating, the protrusion coupled to a panel of the backlight.

17. The display of claim 14, wherein the first light source and the second light source are coupled to a panel, a gap defined between the panel and the display screen, the means for diffusing to diffuse light emitted by one or more of the first light source or the second light source over the gap.

18. The display of claim 14, wherein the backlight further includes a third light source and the means for diffusing includes first means for diffusing disposed between the first light source and the second light source and second means for diffusing disposed between the second light source and the third light source.

19. The display of claim 14, wherein the first light source is disposed proximate to an edge of the display screen, the means for diffusing to cause at least a portion of light emitted by the first light source to be distributed to the edge of the display screen.

20. The display of claim 14, wherein the first light source includes a light emitting diode having one or more chips.

* * * * *